(12) United States Patent
Traub et al.

(10) Patent No.: US 11,036,130 B2
(45) Date of Patent: Jun. 15, 2021

(54) DROP PLACEMENT EVALUATION

(71) Applicant: CANON KABUSHIKI KAISHA, Tokyo (JP)

(72) Inventors: Matthew C. Traub, Austin, TX (US); Tom H. Rafferty, Austin, TX (US); Whitney Longsine, Austin, TX (US); Yeshwanth Srinivasan, New York, NY (US); Van Nguyen Truskett, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 508 days.

(21) Appl. No.: 15/788,462

(22) Filed: Oct. 19, 2017

(65) Prior Publication Data

US 2019/0121231 A1 Apr. 25, 2019

(51) Int. Cl.
*G03F 7/00* (2006.01)
*B05D 5/00* (2006.01)

(52) U.S. Cl.
CPC .................... *G03F 7/0002* (2013.01)

(58) Field of Classification Search
None
See application file for complete search history.

(56) References Cited

U.S. PATENT DOCUMENTS

| | | | |
|---|---|---|---|
| 6,290,319 B1 * | 9/2001 | Boleda | B41J 2/2132 347/19 |
| 6,617,079 B1 * | 9/2003 | Pillion | G03F 7/162 427/10 |
| 6,932,934 B2 | 8/2005 | Choi et al. | |
| 7,157,036 B2 | 1/2007 | Choi et al. | |
| 7,360,851 B1 * | 4/2008 | Snyder | B41J 3/407 347/2 |
| 7,749,553 B2 * | 7/2010 | Teichman | A61F 2/915 427/2.1 |
| 8,512,797 B2 * | 8/2013 | Schumaker | B82Y 10/00 427/256 |
| 2003/0081023 A1 * | 5/2003 | Miller | B41J 2/15 347/9 |
| 2004/0124566 A1 | 7/2004 | Sreenivasan et al. | |
| 2004/0188381 A1 | 9/2004 | Sreenivasan | |
| 2004/0211754 A1 | 10/2004 | Sreenivasan | |

(Continued)

*Primary Examiner* — Cachet I Proctor
(74) *Attorney, Agent, or Firm* — Canon U.S.A., Inc. IP Division

(57) ABSTRACT

Methods and systems for dispensing fluid in imprint lithography, including selecting drop patterns, each associated with different target locations on a substrate and a selected volume for each drop of each drop pattern; selecting a plurality of subsets of nozzles of a dispenser, each subset configured to dispense drops corresponding to each drop pattern; for each drop pattern: dispensing the drops corresponding to the drop pattern from each subset of nozzles; obtaining an image of the drops from each subset of nozzles; and processing the image from each subset of nozzles to determine a positional error of the drops with respect to the target locations and a volumetric error of the drops with respect to the selected volume for each drop; and adjusting, based on the positional error and the volumetric error of the drops from each subset of nozzles for each drop pattern, dispense parameters of the dispenser.

15 Claims, 7 Drawing Sheets

(56) References Cited

U.S. PATENT DOCUMENTS

| | | | | |
|---|---|---|---|---|
| 2004/0231594 A1* | 11/2004 | Edwards | | H01L 21/6838 118/719 |
| 2004/0235036 A1* | 11/2004 | Beutler | | B01L 3/50853 435/6.11 |
| 2005/0083364 A1* | 4/2005 | Billow | | B41J 2/2135 347/19 |
| 2005/0187339 A1 | 8/2005 | Xu et al. | | |
| 2006/0082606 A1* | 4/2006 | Hawkins | | B41J 2/03 347/9 |
| 2007/0042113 A1* | 2/2007 | Ji | | B41J 3/28 427/162 |
| 2007/0145639 A1* | 6/2007 | Seki | | B82Y 10/00 264/293 |
| 2007/0228593 A1* | 10/2007 | Jones | | B29C 43/003 264/40.4 |
| 2009/0096823 A1* | 4/2009 | Watt | | B41J 2/17593 347/10 |
| 2009/0115110 A1* | 5/2009 | Schumaker | | B82Y 10/00 264/401 |
| 2009/0148619 A1* | 6/2009 | LaBrake | | B82Y 10/00 427/511 |
| 2010/0079566 A1* | 4/2010 | Ishikawa | | B41J 2/155 347/92 |
| 2010/0096470 A1* | 4/2010 | Truskett | | B82Y 10/00 239/11 |
| 2010/0098859 A1* | 4/2010 | Schumaker | | B82Y 10/00 427/256 |
| 2010/0101493 A1* | 4/2010 | Hodge | | B05B 12/004 118/697 |
| 2010/0104747 A1* | 4/2010 | Truskett | | H05K 3/125 427/230 |
| 2010/0112220 A1* | 5/2010 | Hodge | | B82Y 10/00 427/256 |
| 2012/0274006 A1* | 11/2012 | Matsumoto | | B29C 43/021 264/571 |
| 2014/0309782 A1* | 10/2014 | Sharpe | | G05D 21/02 700/266 |
| 2015/0099059 A1* | 4/2015 | Harjee | | B41J 2/07 427/8 |
| 2015/0352756 A1* | 12/2015 | Yamaguchi | | G03F 7/0002 264/40.4 |
| 2017/0066208 A1* | 3/2017 | Khusnatdinov | | B29D 11/00865 |
| 2018/0079153 A1* | 3/2018 | Ng | | B29C 64/112 |

\* cited by examiner

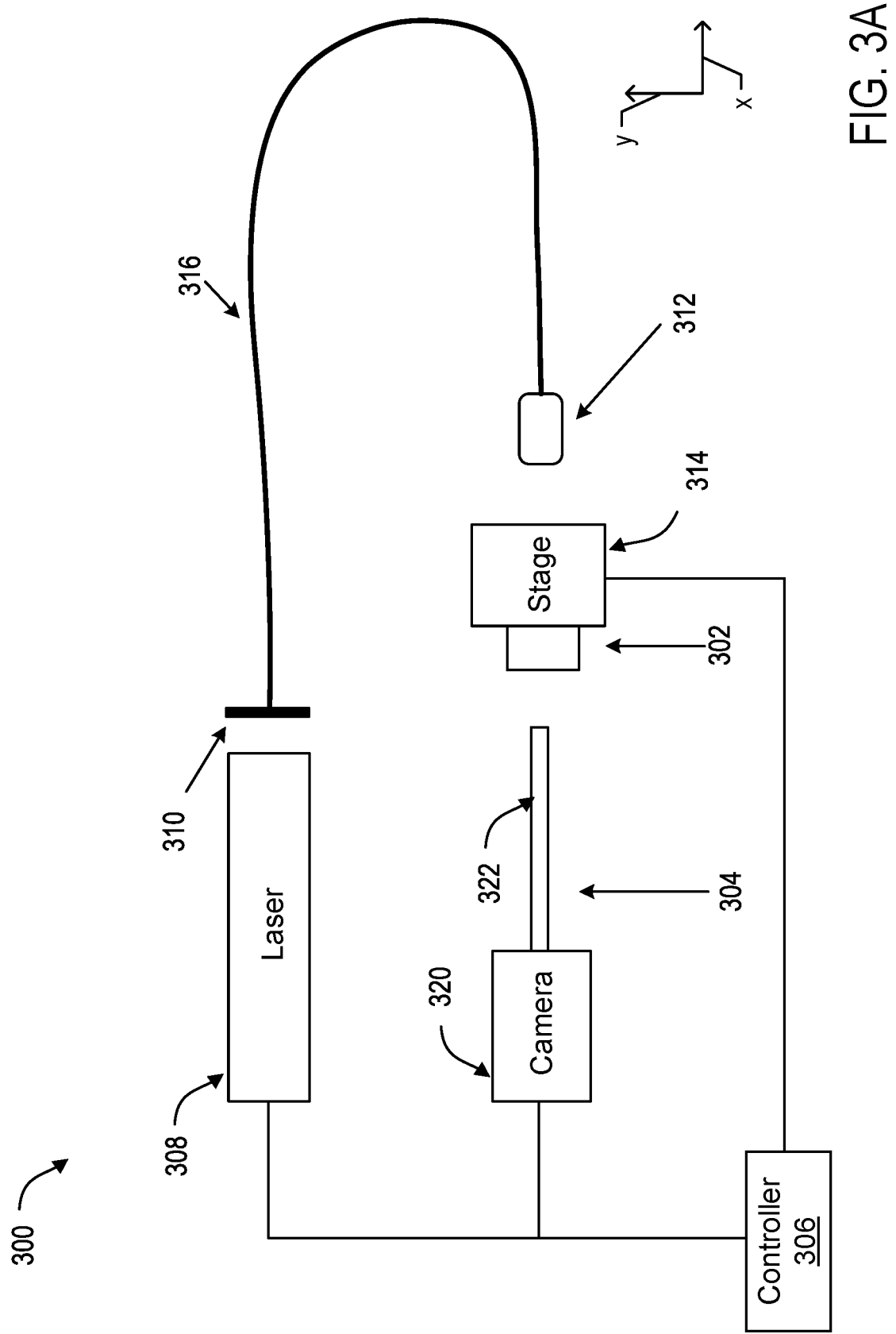

DROP PLACEMENT EVALUATION

FIELD OF ART

The present description relates to dispense systems in imprint lithography.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

Imprint lithography apparatuses, systems and processes are useful for such nano-fabrication applications. Such systems, apparatuses and processes can include the use of fluid dispense systems for depositing a formable material, for example, a polymerizable material, such as a resin or a resist, onto a substrate, for example, a semiconductor wafer, using techniques such as fluid droplet dispense. The dispensed material is contacted with an imprint template (or mold) having desired pattern features and then solidified, forming a patterned layer on the wafer.

Dispense optimization is typically performed for each fluid composition by manually setting parameters of the imprint lithography apparatus or system and dispense system to obtain a given drop volume, printing a test pattern with the lithography apparatus or system, and running an inspection of the printed drops to determine whether the drops are within allowed tolerances. If the drops are outside of allowed tolerances, new parameters are manually set and the process is repeated. This can represent a significant resource and time commitment, and can lead to an increased dispense development time.

SUMMARY

Innovative aspects of the subject matter described in this specification may be embodied in a method of dispensing fluid in imprint lithography. The method includes selecting a set of drop patterns, each drop pattern associated with a different set of target drop locations on a substrate and a selected volume for each drop of each drop pattern; selecting a plurality of subsets of nozzles of a dispenser, each subset of nozzles configured to dispense a plurality of drops corresponding to each drop pattern on the substrate; for each drop pattern: i) dispensing the plurality of drops corresponding to the drop pattern from each subset of nozzles in accordance with dispense parameters of the dispenser; ii) obtaining an image of the plurality of drops from each subset of nozzles after the plurality of drops has been dispensed and prior to contact of the plurality of drops with the substrate; and iii) processing the image from each subset of nozzles to determine a positional error of the plurality of drops with respect to the target drop locations on the substrate and a volumetric error of the plurality of drops with respect to the selected volume for each drop; and adjusting, based on the positional error and the volumetric error of the plurality of drops from each subset of nozzles for each drop pattern, one or more of the dispense parameters of the dispenser.

Other embodiments of these aspects include corresponding systems configured to perform the actions of the methods.

These and other embodiments may each optionally include one or more of the following features. For instance, after adjusting the one or more of the dispense parameters of the dispenser, for each drop pattern: i) dispensing an additional plurality of drops corresponding to the drop pattern from each subset of nozzles in accordance with the adjusted dispense parameters of the dispenser; ii) obtaining an additional image of the additional plurality of drops from each subset of nozzles after the additional plurality of drops has been dispensed and prior to contact of the additional plurality of drops with the substrate; and iii) processing the additional image from each subset of nozzles to determine an additional positional error of the additional plurality of drops with respect to the target drop locations on the substrate and an additional volumetric error of the additional plurality of drops with respect to the selected volume for each additional drop; and further adjusting, based on the additional positional error and the additional volumetric error of the additional plurality of drops from each subset of nozzles for each drop pattern, one or more of the adjusted dispense parameters of the dispenser.

The features further include adjusting at least one of a voltage and a waveform of the dispenser. Selecting a first subset of nozzles positioned at interior of an intended dispense area and selecting a second subset of nozzles positioned at a periphery of the intended dispense area. For each drop of the plurality of drops, assessing the drop volume, the drop velocity, the drop ejection time, and the drop trajectory. Determining, for each drop of the plurality of drops, a volume difference between the assessed drop volume and a target drop volume; determining, for each drop of the plurality of drops, a velocity difference between the assessed drop velocity and a target drop velocity; determining, for each drop of the plurality of drops, a drop ejection time difference of the assessed drop ejection time and a target drop ejection time; determining, for each drop of the plurality of drops, a drop trajectory difference of the assessed drop trajectory and a target drop trajectory; and determining, based on at least one of the volume difference, the velocity difference, the drop ejection time difference, and the drop trajectory difference, the positional error of the plurality of drops with respect to the target drop locations on the substrate and the volumetric error of the plurality of drops with respect to the selected volume for each drop. Adjusting one or more of the dispense parameters of the dispenser to minimize the positional error and the volumetric error of the plurality of drops from each subset of nozzles for each drop pattern.

Innovative aspects of the subject matter described in this specification may be embodied in a system for dispensing fluid in imprint lithography. The system includes a dispenser comprising a plurality of nozzles configured to dispense a plurality of drops; an imaging module configured to obtain images of the plurality of drops; a controller in communication with the dispenser and the imaging module, the controller configured to: select a set of drop patterns, each drop pattern associated with a different set of target drop locations on a substrate and a selected volume for each drop; select a plurality of subsets of nozzles of the dispenser, each subset of nozzles configured to dispense drops corresponding to each drop pattern on the substrate; for each drop pattern: i) provide a first signal to the dispenser to dispense a plurality of drops corresponding to the drop pattern from each subset of nozzles in accordance with dispense parameters of the dispenser, ii) provide a second signal to the imaging module to obtain an image of the plurality of drops from each subset of nozzles after the plurality of drops has been dispensed and prior to contact of the plurality of drops with the substrate, and iii) process the image from each subset of nozzles to determine a positional error of the plurality of drops with respect to the target drop locations on the substrate and a volumetric error of the plurality of drops with respect to the selected volume for each drop; and provide a third signal to the dispenser to adjust one or more of the dispense parameters based on the positional error and the volumetric error of the plurality of drops from each subset of nozzles for each drop pattern.

Other embodiments of these aspects include corresponding method configured to perform the actions of the system.

These and other embodiments may each optionally include one or more of the following features. For instance, the imaging module includes a camera and a microscope objective lens. The system further includes a laser, a fluorescent source, and light collimating optics that are in communication with the imaging module, the optics configured to provide a plurality of light pulses for the imaging module to obtain the image. The one or more dispense parameters are selected from a group consisting of a voltage and a waveform of the dispenser.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

FIGS. 3A, 3B illustrate a simplified side view of a system for dispensing fluid and evaluation of dispensing of droplets of the fluid.

DETAILED DESCRIPTION

Figure 1:
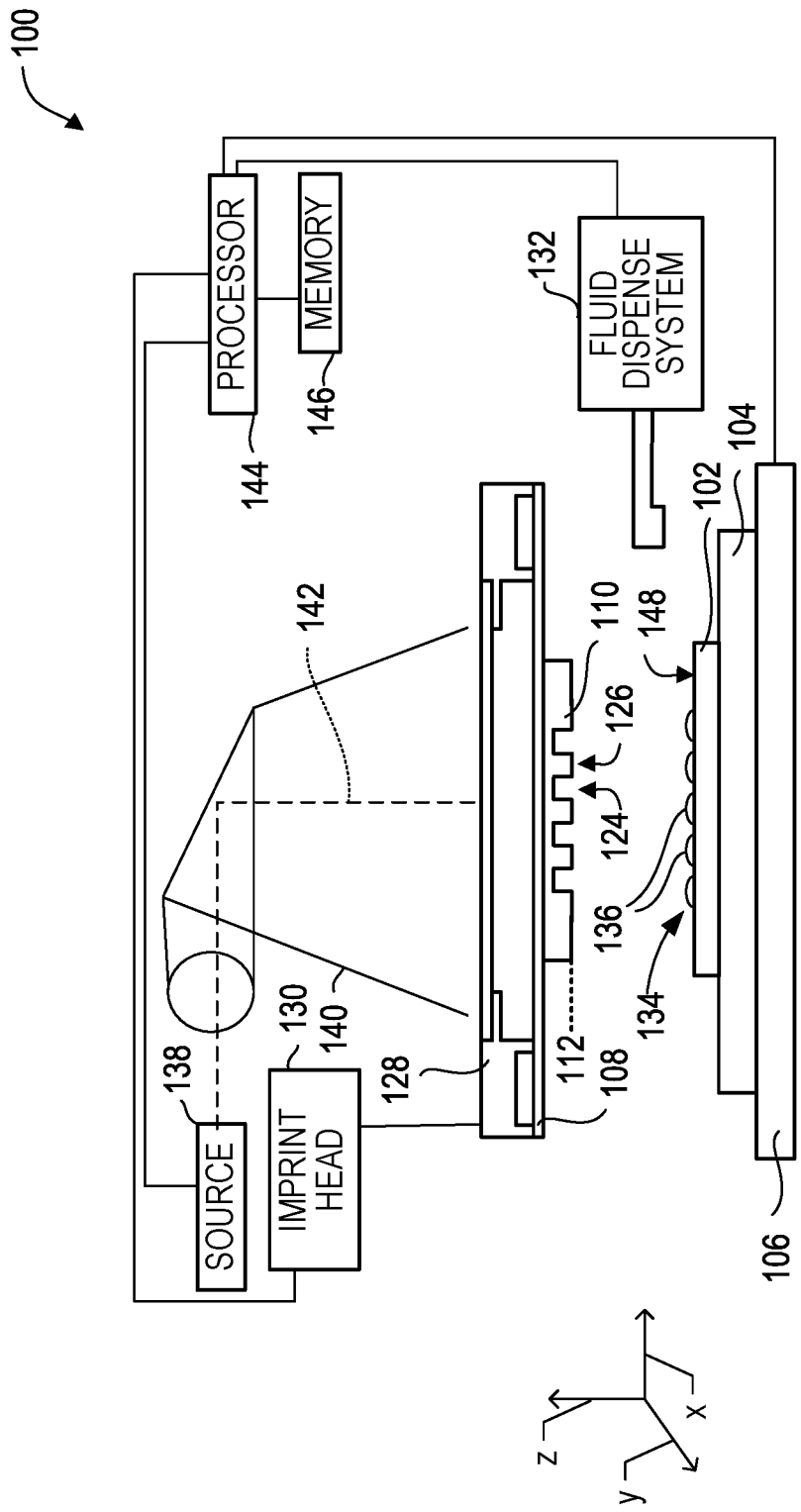
FIG. 1 illustrates a simplified side view of a lithographic system.

FIG. 1 illustrates an imprint lithography system 100 that forms a relief pattern on a substrate 102. The substrate 102 may be coupled to a substrate chuck 104. The substrate chuck 104 is configured to hold the substrate 102. In some examples, the substrate chuck 104 can include a vacuum chuck, a pin-type chuck, a groove-type chuck, an electromagnetic chuck, and the like. Exemplary chucks are described in U.S. Pat. No. 6,873,087, which is hereby incorporated by reference herein. The substrate 102 and the substrate chuck 104 may be further supported by a stage 106. The stage 106 provides motion about the x- and y-axes, and rotation about the z-axis. The stage 106, the substrate 102, and the substrate chuck 104 may also be positioned on a base (not shown).

The imprint lithography system 100 further includes an imprint lithography template 108 that is spaced apart from the substrate 102. In some examples, the template 108 includes a mesa 110 (mold 110) that extends from the template 108 towards the substrate 102. In some examples, the template 108 includes a patterning surface 112. The template 108 and the mold 110 may be formed from such materials including, but not limited to, fused-silica, quartz, silicon, organic polymers, siloxane polymers, borosilicate glass, fluorocarbon polymers, metal, hardened sapphire, and the like. In the illustrated example, the patterning surface 112 includes a plurality of features defined by spaced-apart recesses 124 and protrusions 126. However, in some examples, other configurations of features are possible. The patterning surface 112 may define any original pattern that forms the basis of a pattern to be formed on substrate 102.

The template 108 may be coupled to a template chuck 128. The template chuck 128 is configured to hold the template 108. In some examples, the template chuck 128 can include a vacuum chuck, a pin-type chuck, a groove-type chuck, an electromagnetic chuck, and the like. Exemplary chucks are described in U.S. Pat. No. 6,873,087. Further, the template chuck 128 may be coupled to an imprint head 130 such that the template chuck 128, the imprint head 130, or both, may be configured to facilitate movement of the template 108. The imprint head 130 is configured to adjust a distance between the patterning surface 112 and a surface 148 of the substrate 102.

The imprint lithography system 100 may further include a fluid dispense system 132. The fluid dispense system 132 may be used to deposit a polymerizable material 134 on the surface 148 of the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and the like. In some examples, the polymerizable material 134 is positioned upon the substrate 102 before a desired volume is defined between the template 108 and the substrate 102. In some examples, the polymerizable material 134 is positioned upon the substrate 102 after the desired volume is defined between the template 108 and the substrate 102. The polymerizable material 134 may include a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
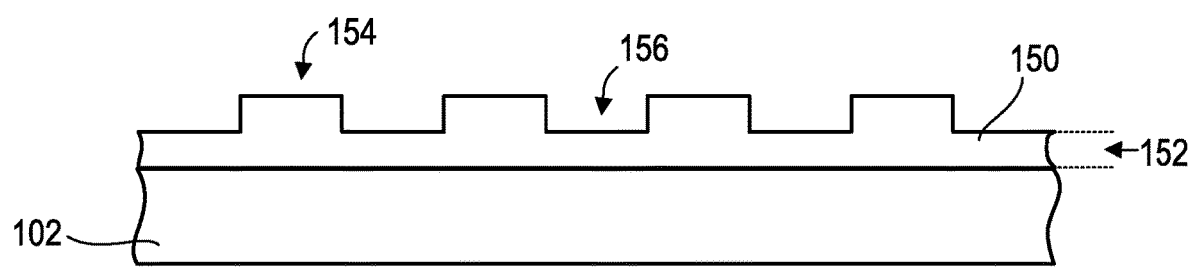
FIG. 2 illustrates a simplified side view of the substrate shown in FIG. 1 having a patterned layer positioned thereon.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a processor 144 in communication with the stage 106, the imprint head 130, the fluid dispense system 132, and the energy source 138, and may operate on a computer readable program stored in a memory 146.

In some examples, the imprint head 130, the stage 106, or both, vary a distance between the template 108 and the substrate 102 to define a desired volume therebetween that is filled by the polymerizable material 134. For example, the imprint head 130 may apply a force to the template 108 such that the template 108 contacts the polymerizable material 134. After the desired volume is filled by the polymerizable material 134, the energy source 138 produces energy 140, e.g., broadband ultraviolet radiation, causing the polymerizable material 134 to solidify, cross-link, or both, conforming to shape of a surface 148 of the substrate 102 and the patterning surface 112, defining a patterned layer 150 on the substrate 102 after separation between the template 108 and the substrate 102. In some examples, the patterned layer 150 (or polymeric layer 150) may include a residual layer 152 and a plurality of features shown as protrusions 154 and recessions 156, with the protrusions 154 having a thickness $t_1$ and the residual layer 152 having a thickness $t_2$.

The herein-described system and process may be further implemented in imprint lithography processes and systems, such as those referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

In imprint lithography systems, as throughput and defect targets become more aggressive, the fluid dispense system 132 must deliver smaller and smaller drops with tighter pitch and improved accuracy. Smaller drops at tighter pitches reduces fill time and improved drop placement accuracy reduces non-fill defects. The formulation of the polymerizable material 134 may not be able to be tuned to meet dispense requirements, but rather tuned around other process steps (separation, fill, etch, etc.) and as these resists evolve, dispense optimization may need to be repeated for each new composition of the polymerizable material 134. However, dispense optimization can represent a significant bottleneck in the testing of new resist compositions.

Thus, it may be advantageous to provide a system and a method that provides systematic imaging of the dispense system (in particular, dispense nozzles of the dispense system), image processing to extract all relevant parameters for placement of the drops, and summation of errors for each dispense nozzle to create a total placement map for the dispense system. By quantifying these effects, automated algorithms to optimize the process can be facilitated.

Furthermore, as the system 100 is utilized commercially, the system 100 can be implemented to produce various devices under differing process conditions. For example, the system 100 can be implemented with differing templates each with differing feature patterns and/or differing compositions of polymerizable material 134 to produce the differing devices. To that end, it may be advantageous to provide a system and a method that facilitates adjustments of the system 100 to meet the requirements of producing the differing devices.

Figure 3B:
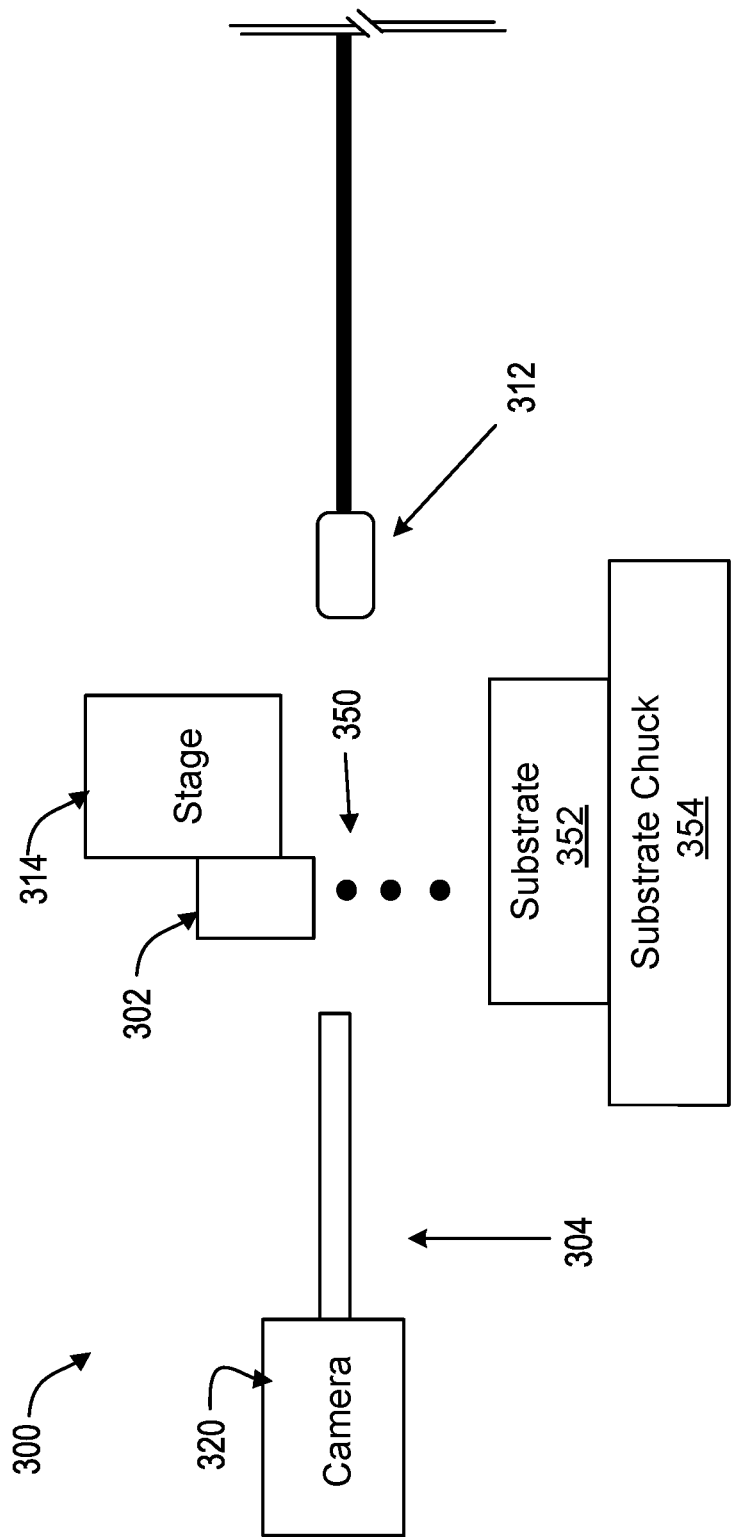

FIGS. 3A and 3B illustrate a system 300 for dispensing fluid, including the evaluation of dispensing of droplets of the fluid. The system 300 includes a dispenser 302, an imaging module 304, a controller 306, a laser 308, a fluorescent source 310, light collimating optics 312, a stage 314, a light guide fiber 316, a substrate 352, and a substrate chuck 354. In some examples, the dispenser 302 includes an imprint lithography dispense head.

The dispenser 302 can be similar to the fluid dispense system 132 of FIG. 1. In some examples, the dispenser 302 can include a plurality of nozzles configured to dispense a plurality of drops 350 of fluid, as described with respect to FIG. 1. The imaging module 304 is configured to obtain images of the plurality of drops 350. The imaging module 304 includes a camera 320 and a microscope objective lens 322. In some examples, the camera 320 is a double shutter camera. The laser 308 and the fluorescent source 310 are configured to provide a plurality of light pulses via the light guide fiber 316 to the light collimating optics 312. In some examples, the laser 308 is a dual-cavity laser. The light collimating optics 312 provides the light pulses such that the imaging module 304 can obtain the images of the plurality of drops 350, e.g., as the drops 350 are dispensed from the dispenser 302. The stage 314 is coupled to the dispenser 302 to provide motion of the dispenser 302 along the x- and y-directions. The substrate chuck 354 is configured to hold the substrate 352, similar to the substrate chuck 104 and the substrate 102, respectively, described with respect to FIG. 1.

The controller 306 is in communication with the dispenser 302, the imaging module 304, the laser 308, the optics 312, and the stage 314. The controller 306 is configured to select a set of drop patterns to be deposited on the substrate 352 (e.g., on one or more fields of the substrate 352) and provide a signal to the dispenser 302 to dispense the drop patterns. The controller 306 is further configured to provide a signal to the imaging module 304 to obtain images of the drops 350 of the drop patterns and process the images. The controller 306 is further configured to provide a signal to the dispenser 302 to adjust dispense parameters of the dispenser 302. In some examples, the controller 306 includes one or more processors.

The system 300 dispenses drops 350 of fluid on the substrate 352 corresponding to multiple drop patterns, images the drops 350 for each drop pattern, and determines positional and volumetric errors of the drops 350 for each drop pattern. Based on such errors, the system 300 is able to adjust dispense parameters of the dispenser 302 to compensate for the errors.

In some implementations, the controller 306 selects a set of drop patterns of drops 350 (from multiple possible drop patterns) to be dispensed by the dispenser 302 on the substrate 352. The drop patterns are associated with target drop locations on the substrate 352 and a selected volume for each drop 350 of the drop pattern. That is, a particular drop pattern indicates a target (desired) position of each drop 350 that is to be dispensed on the substrate 352; and further indicates a volume of each drop 350 that is to be dispensed on the substrate 352. In some examples, for a particular drop pattern, the volume of a subset of the drops 350 differs from the volume of the remaining drops 350 of the drop pattern. In some examples, each drop pattern (of the multiple possible drop patterns) is associated with a different set of target drop locations on the substrate 352 and a different selected volume for each drop 350 of each drop pattern.

Figure 4A:
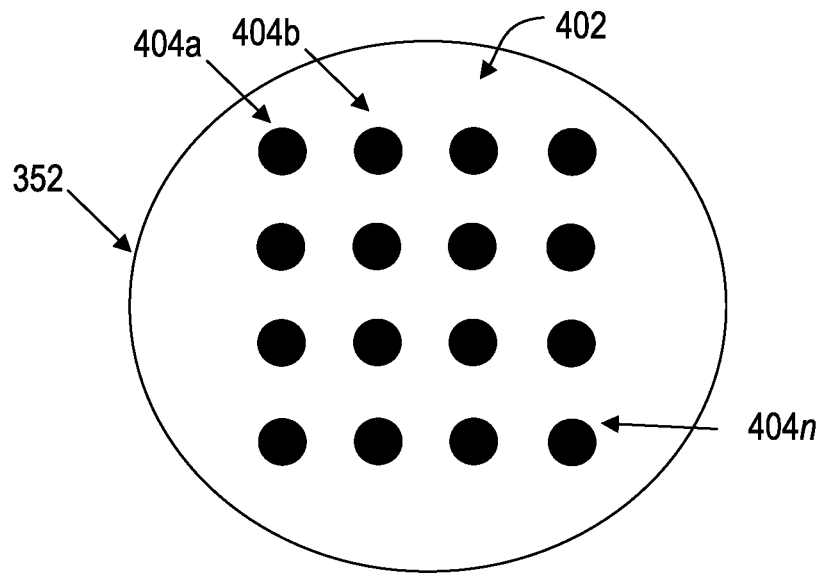
FIGS. 4A, 4B illustrate examples of drop patterns.

FIG. 4A illustrates an example of a selected drop pattern 402 to be dispensed on the substrate 352. The drop pattern 402 includes target locations 404a, 404b, . . . , 404n (collectively referred to as target locations 404). The target locations 404 represent desired positions on the substrate 352 of the drops 350 to be dispensed by the dispenser 302, and in particular, the nozzles of the dispenser 302. In some examples, the target locations 404 can be equally spaced apart from other target locations 404. In some examples, a subset of the target locations 404 are spaced apart from the other target locations 404 of the subset.

Figure 4B:
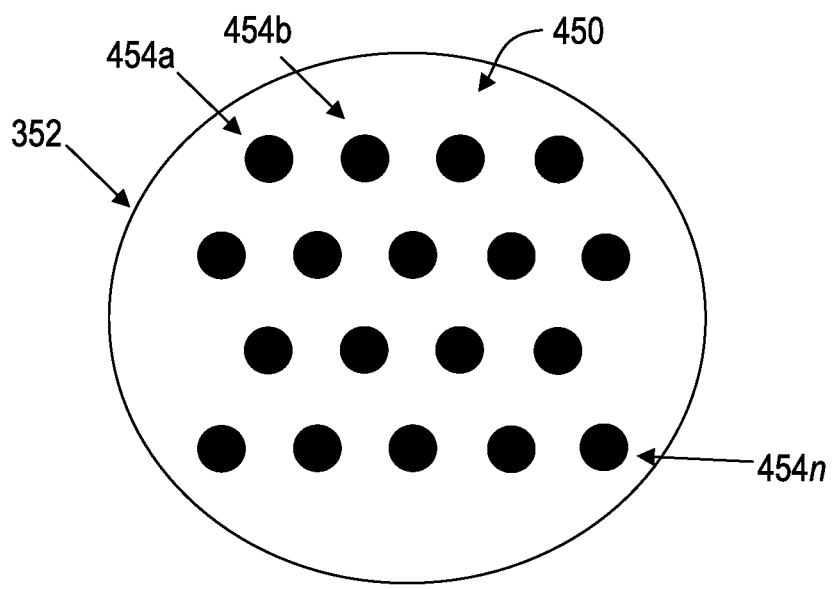

FIG. 4B illustrates an example of a selected drop pattern 450 to be dispensed on the substrate. The drop pattern 450 includes target locations 454a, 454b, . . . , 454n (collectively referred to as target locations 454). The target locations 454 represent desired positions on the substrate 352 of the drops 350 to be dispensed by the dispenser 302, and in particular, the nozzles of the dispenser 302. In some examples, the target locations 454 can be equally spaced apart from other target locations 454. In some examples, a subset of the target locations 454 are spaced apart from the other target locations 454 of the subset.

In some examples, the drop patterns are grid arrays. In some examples, the grid-array based drop patterns include periodicities that correlate to pattern features of an imprint lithography template (e.g., the template 108 of FIG. 1) that is used in an imprint lithography process (e.g., patterning of the substrate 352).

Referring back to FIGS. 3A and 3B, in some implementations, the controller 306 selects a plurality of subsets of the nozzles of the dispenser 302 for dispensing of the drops for the drop patterns. Specifically, each subset of nozzles (of the plurality of subsets of nozzles of the dispenser 302) is configured to dispense a plurality of drops 350 corresponding to each drop pattern (e.g., drop patterns 402, 450,) on the substrate 352. That is, each drop pattern can be dispensed by multiple (differing) subsets of nozzles of the dispenser 302 on the substrate 352 (e.g., on differing fields of the substrate 352).

Figure 5:
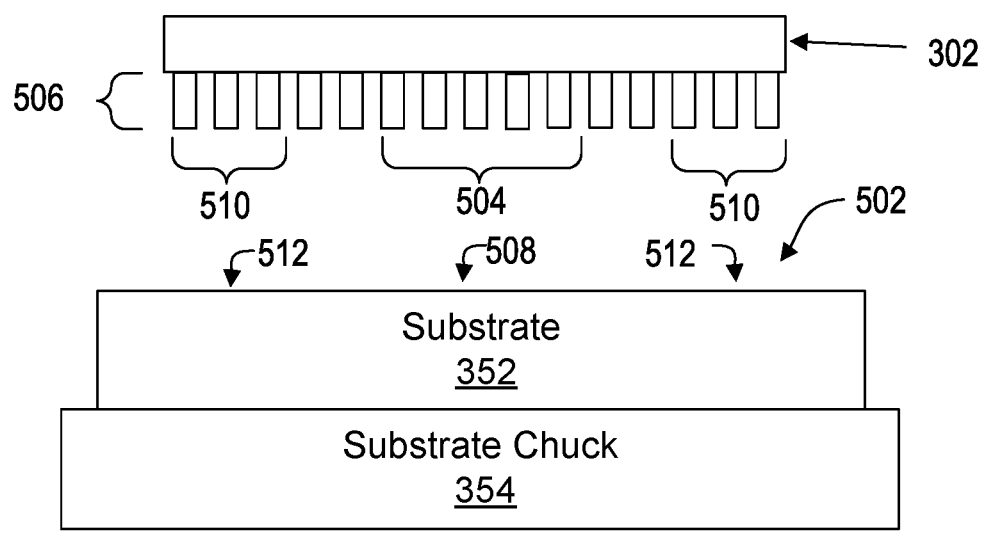
FIG. 5 illustrates a dispenser positioned proximate to an intended dispense area of the substrate.

In some examples, the controller 306 selects a first subset of nozzles positioned at an interior of an intended dispense area and selects a second subset of nozzles positioned at a periphery of the intended dispense area. As illustrated in FIG. 5, the dispenser 302 is positioned proximate an intended dispense area 502 of the substrate 352. The dispenser 302 includes a first subset 504 of nozzles 506 positioned proximate an interior 508 of the dispense area 502, and includes a second subset 510 of nozzles 506 positioned proximate a periphery 512 of the dispense area 502. In some examples, the periphery 512 of the dispense area 502 surrounds the interior 508 of the dispense area 502. In some examples, the second subset 510 of nozzles 506 surrounds the first subset 504 of nozzles 506.

In some implementations, for each drop pattern, the controller 306 sends a first signal to the dispenser 302 to dispense a plurality of drops 350 corresponding to the drop pattern from each subset of nozzles in accordance with (initial) dispense parameters of the dispenser 302. In response to the first signal, for each drop pattern, the dispenser 302 dispenses the plurality of drops 350 corresponding to the drop pattern from each subset of nozzles in accordance with the (initial) dispense parameters.

In some examples, the dispense parameters can include a voltage and a waveform of the dispenser 302. Specifically, the voltage of the dispenser 302 is associated with a drop speed and a drop volume of each of the drops 350 that are being dispensed by the subsets of dispense nozzles—e.g., an increased voltage of the dispenser 302 increases the drop speed and drop volume of the drops 350. The waveform of the dispenser 302 controls the timing sequence of piezo elements of each dispense nozzle of the dispenser 302 to determine the drop speed and the drop volume of the drops 350 that being dispensed by the subsets of the nozzles.

In some implementations, for each drop pattern, the controller 306 provides a second signal to the imaging module 304 to obtain an image of the plurality of drops 350 from each subset of nozzles. The imaging module 304 obtains the image of the plurality of drops 350 from each subset of nozzles after the plurality of drops have been dispensed by the dispenser 302 and prior to contact of the plurality of drops with the substrate 352. That is, in other words, the imaging module obtains the images of the plurality of drops 350 that are dispensed by each subset of nozzles while the drops are "in-flight"—while the drops are positioned between the nozzles and the substrate 352.

In some examples, the imaging module 304 obtains multiple images of each plurality of drops 350 from each subset of nozzles after each plurality of drops 350 has been dispensed by the dispenser 302 and prior to contact of each plurality of drops 350 with the substrate 352

In some implementations, for each drop pattern, the controller 306 processes the image from each subset of nozzles. Specifically, for each drop pattern, the controller 306 process the images to determine i) a positional error of the plurality of drops 350 with respect to the target drop locations on the substrate and ii) a volumetric error of the plurality of drops 350 with respect to the selected volume of each drop 350. That is, for each drop pattern, the controller 306 identifies one or more parameters associated with the images from each subset of nozzles, and based on the identified parameters, determines the positional error and the volumetric error. The identified parameters can include, for each nozzle, the drop volume, the drop velocity, the drop ejection time, and the drop trajectory. That is, for each drop of the plurality of drops 350, the controller 306 assesses the drop volume, the drop velocity, the drop ejection time, and the drop trajectory. For simplicity, error sources along the print direction are termed errors in the x-direction, while those along the direction of the nozzles are termed errors in the y-direction.

In some examples, the controller 306, for each drop of the plurality of drops 350, determines a volume difference between the assessed drop volume and a target drop volume. In some examples, the controller 306 can assess the drop volume of each drop of the plurality of drops 350 based on a drop diameter of the drop to estimate the volume. For example, the controller 306, based on the image from the imaging module 304, can determine the drop diameter of the drop that is used to estimate the volume. In some examples, the controller 306 can assess the drop volume of each drop of the plurality of drops 350 gravimetrically. For example, the controller 306 can obtain a weight of the drop by weighing the drops and calculating the dispensed volume per drop based on the measured mass, number of drops dispensed, and a fluid density of the drop. The controller 306, for each drop pattern, determines the volumetric error of the plurality of drops 350 with respect to the selected volume for each drop.

In some examples, the controller 306, for each drop of the plurality of drops 350, determines a velocity difference between the assessed drop velocity and a target drop velocity. For example, the velocity $V_n$ of the drops 350 associated with each nozzle is substantially the same—thus, the average nozzle velocity $V_{avg}$ is the same as $V_n$ for each nozzle. However, the nozzle velocity $V_n$ for any particular nozzle can vary from $V_{avg}$—leading to variations in time for the drop 350 to reach the substrate 352 when dispensed (times-of-flight variations), as well as the location at which the drop 350 is deposited on the substrate 352 (placement errors). The time-of-flight for each nozzle is a ratio of the throw distance D (distance from the nozzle to the substrate 352—e.g., 250 micrometers) to the velocity $V_n$ of the drops 350 from the nozzle (e.g., $D/V_n$). Based on the target drop velocity (e.g., as provided in the initial dispense parameters) and the assessed drop velocity, the controller 306 determines the velocity difference between the assessed drop velocity and the target drop velocity.

The controller 306 determines a first positional error $E_v$ of the plurality of drops with respect to the target drop locations on the substrate 352 at least in part based on the velocity difference between the assessed drop velocity and the target drop velocity. Specifically, the first positional error is at least in part based on the multiple of the variation in transit time and a speed of the stage 314. That is, in some examples, the first positional error is defined as:

$$E_v = \left( \frac{D}{V_{avg}} - \frac{D}{V_n} \right) \times S; \qquad (1)$$

where $E_y$ is the first positional error, D is the throw distance, $V_{avg}$ is the average nozzle velocity, $V_n$ is the nozzle velocity, and S is the speed of the stage 314.

In some examples, the imaging module 304 obtains two separate images of the drops that are microseconds apart in time (e.g., the laser 308 is a dual-cavity laser providing two light pulses that the camera 320 images in separate frames when the camera 320 is a double shutter camera). The controller 302, based on the two separate images, can determine a center of the drop in each image and calculate the velocity difference $V_d$ from the change in position of the drop 350 and the delay time.

In some implementations, the controller 306, for each drop 350 of the plurality of drops 350, demines a drop ejection time difference between the assessed drop ejection time and the target drop ejection time. For example, the drops 350 that are ejected from the nozzles at different times will affect the time of depositing the same on the substrate 352. The imaging module 304 can obtain images as the drop 350 emerges from the nozzles. The controller 306 processes the images to assess the drop ejection time for each drop 350. Based on the target drop ejection time (e.g., as provided in in the initial dispense parameters) and the assessed drop ejection time, the controller 306 determines the drop ejection time difference between the assessed drop ejection time and the target drop ejection time.

The controller 306 determines a second positional error $E_{et}$ of the plurality of drops 350 with respect to the target drop locations on the substrate 352 at least in part based on the drop ejection time difference between the assessed drop ejection time and the target drop ejection time. Specifically, in some examples, the second positional error is defined as:

$$E_{et} = T_v \times S; \tag{2}$$

where $E_{et}$ is the second positional error, $T_v$ is the drop ejection time difference, and S is the speed of the stage 314.

In some implementations, the controller 306, for each drop 350 of the plurality of drops 350, demines a drop trajectory difference between the assessed drop trajectory and the target drop trajectory. For example, similar to that mentioned above, the imaging module 304 can obtain multiple images of the drops 350 (e.g., the camera 320 including a double shutter capability). The controller 306 processes the images to assess the drop trajectory for each drop 350. Based on the target drop trajectory (e.g., as provided in the initial dispense parameters) and the assessed drop trajectory, the controller 306 determines the drop trajectory difference in the imaging plane—e.g., the y-direction.

The controller 306 determines a third positional error $E_{ay}$ in the imaging plane (the y-direction) of the plurality of drops 350 with respect to the target drop trajectory at least in part based on the difference between the assessed drop trajectory and the target drop trajectory. Specifically, in some examples, the third positional error is defined as:

$$E_{ay} = D \times \tan\theta; \tag{3}$$

where $E_{ay}$ is the third positional error, D is the target drop trajectory, and β is the angle between the target drop trajectory and the assessed drop trajectory in the y-direction.

Further, similar to the above, the controller 306 determines a fourth positional error $E_{ax}$ out of the imaging plane (the x-direction) of the plurality of drops with respect to the target drop trajectory at least in part based on the difference between the assessed drop trajectory and the target drop trajectory. Specifically, in some examples, the fourth positional error is defined as:

$$E_{ax} = D \times \tan\alpha; \tag{4}$$

where $E_{ax}$ is the fourth positional error, D is the target drop trajectory, and α is the angle between the target drop trajectory and the assessed drop trajectory in the x-direction.

Further, in some examples, as the fourth positional error can be along the imaging axis, the camera 320 can include a high numerical aperture (NA) lens to facilitate assessing the drop trajectory. That is, the high numerical aperture lens can be associated with a depth of focus of less than 2 microns (e.g., a 0.42 NA microscope objective has a depth of focus of less than 2 microns, and more specifically, between 1 and 2 microns). The controller 306 can assess the drop size of the drop 350 at different distances from the nozzle (via the multiple images provided by the imagining module 304) to facilitate in determining the fourth positional error (e.g., the out-of-plane deviation).

In some implementations, the controller 306 determines the positional error of the plurality of drops 350 with respect to the target drop locations on the substrate 352. Specifically, the controller determines the positional error, for each drop 350 of each drop pattern that is dispensed by each of the subset of nozzles, based on, for the drop 350, the velocity difference, the drop ejection time difference, and the drop trajectory difference. That is, for each drop pattern, the positional error in the x-direction at a particular nozzle is at least in part based on the first, second, and fourth positional errors. In some examples, the positional error in the x-direction is defined as:

$$E_x = \left(\frac{D}{V_{avg}} - \frac{D}{V_n}\right) \times S + T_v \times S + D \times \tan\alpha; \tag{5}$$

where $E_x$ is the positional error in the x-direction, D is the target drop velocity, $V_{avg}$ is the average nozzle velocity, $V_n$ is the particular nozzle velocity, S is the speed of the stage 314, $T_v$ is drop ejection time difference, and α is the angle between the target drop trajectory and the assessed drop trajectory in the x-direction.

Further, for each drop pattern, the positional error in the y-direction for a particular nozzle is at least in part based on the third positional error. In some examples, the positional error in the y direction is defined as:

$$E_y = D \times \tan\theta; \tag{6}$$

where $E_{ay}$ is the third positional error, D is the target drop trajectory, and β is the angle between the target drop trajectory and the assessed drop trajectory in the y-direction In some implementations, the controller 306 provides a third signal to the dispenser 302 to adjust the (initial) dispense parameters of the dispenser 302. Specifically, the controller 306 adjusts the dispense parameters of the dispenser 302 at least in part based on the positional error and the volumetric error of the plurality of drops 350 from each subset of nozzles for each drop pattern. The controller 306 can determine the appropriate adjustment of the parameters of the dispenser 302 to minimize the positional error and the volumetric error of the plurality of drops 350 from each subset of nozzles for each drop pattern. For example, the controller 306 can provide the third signal to the dispenser 302 such that the dispenser 302, in response to the third signal, adjust the parameters to minimize the positional error and the volumetric error of the plurality of drops from each subset of nozzles for each drop pattern.

In some examples, the controller 306 can determine adjustments to the voltage and/or the waveform of the dispenser 302 to minimize the positional error and the volumetric error of the plurality of drops 350 from each subset of nozzles for each drop pattern. Based on the determined adjustments, the controller 306 can generate the third signal and provide the same to the dispenser 302 such that the dispenser 302 can adjust the voltage and/or the waveform accordingly. For example, the controller 306 can determine a voltage adjustment to the dispenser 302 to increase or decrease the drop speed and drop volume of the drops 350. Further, for example, the controller 306 can determine a waveform adjustment to the dispenser 302 to adjust the timing sequence of the piezo elements of each nozzle of the dispenser 302 to affect the drop speed and the drop volume of the drops 350 that are being dispensed by the subsets of the nozzles.

Figure 6:
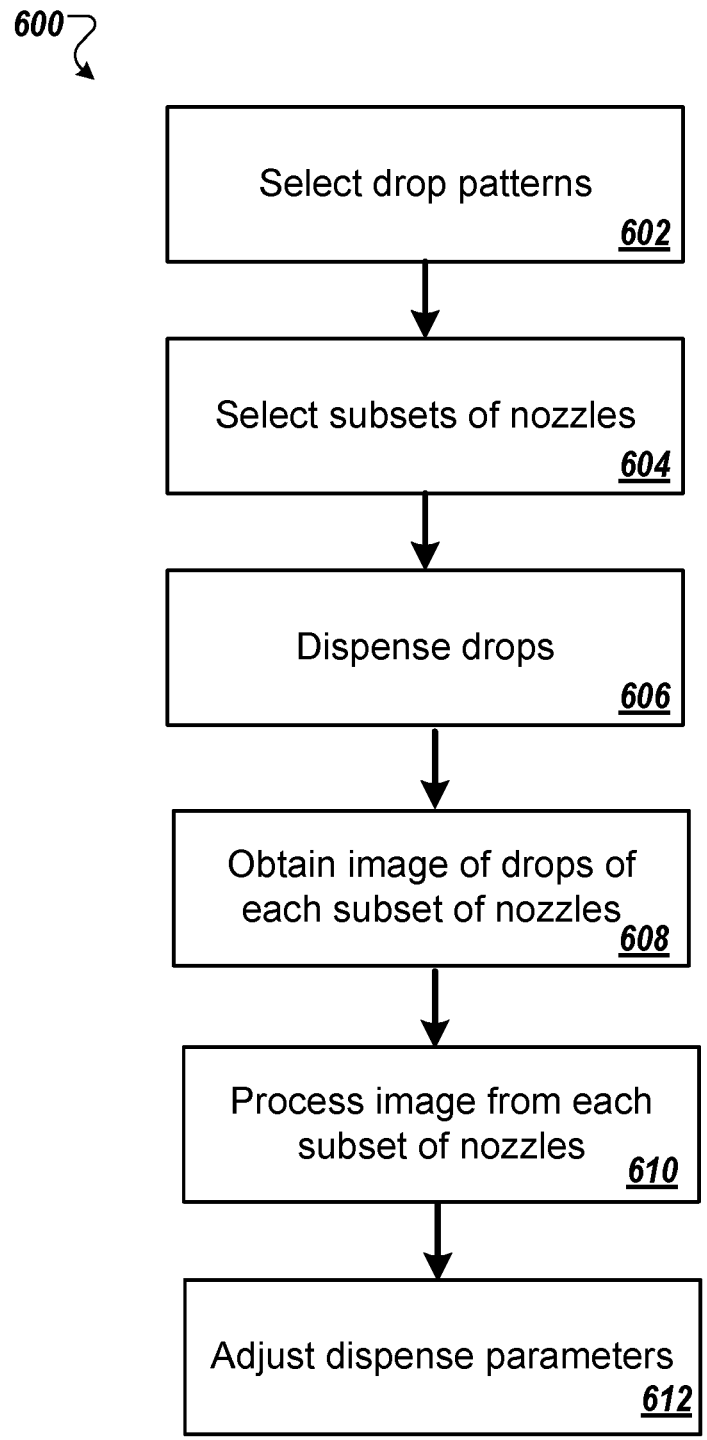
FIG. 6 is a flow chart of an example method of evaluating the dispense of droplets of the fluid.

FIG. 6 illustrates an example method for evaluating the dispensing of droplets on a substrate. The process 600 is illustrated as a collection of referenced acts arranged in a logical flow graph. The order in which the acts are described is not intended to be construed as a limitation, and any number of the described acts can be combined in another order and/or in parallel to implement the process.

A set of drop patterns is selected (602). For example, the controller 306 selects a set of drop patterns of drops 350 (from multiple possible drop patterns) to be dispensed by the dispenser 302 on the substrate 352. In some examples, each drop pattern is associated with a different set of target drop locations on a substrate and a selected volume for each drop of each drop pattern. A plurality of subsets of nozzles of a dispenser are selected (604). For example, the controller 306 selects a plurality of subsets of the nozzles of the dispenser 302 for dispensing of the drops 350 for the drop patterns. In some examples, each subset of nozzles is configured to dispense a plurality of drops 350 corresponding to each drop pattern on the substrate.

For each drop pattern, the plurality of drops are dispensed (606). For example, controller 306 sends a first signal to the dispenser 302 to dispense a plurality of drops 350. In response to the first signal, for each drop pattern, the dispenser 302 dispenses the plurality of drops 350 corresponding to the drop pattern from each subset of nozzles. In some examples, corresponding to the drop pattern from each subset of nozzles in accordance with dispense parameters of the dispenser. For each drop pattern, an image of the plurality of drops from each subset of nozzles are obtained (608). For example, the controller 306 provides a second signal to the imaging module 304 to obtain an image of the plurality of drops 350 from each subset of nozzles. The imaging module 304 obtains the image of the plurality of drops 350 from each subset of nozzles. In some examples, the image is obtained after the plurality of drops 350 has been dispensed and prior to contact of the plurality of drops 350 with the substrate. For each drop pattern, the image from each subset of nozzles is processed (610). For example, for each drop pattern, the controller 306 processes the image from each subset of nozzles. In some examples, the image is processed to determine a positional error of the plurality of drops 350 with respect to the target drop locations on the substrate and a volumetric error of the plurality of drops 350 with respect to the selected volume for each drop 350.

One or more of the dispense parameters of the dispenser are adjusted (612). For example, the controller 306 provides a third signal to the dispenser 302 to adjusts the (initial) dispense parameters of the dispenser 302, and the dispenser 302, in response to the third signal, adjust the parameters. In some examples, based on the positional error and the volumetric error of the plurality of drops 350 from each subset of nozzles for each drop pattern

The invention claimed is:

1. A method of dispensing fluid in imprint lithography, the method comprising:
   selecting a set of drop patterns, each drop pattern associated with a different set of target drop locations on a substrate and selected volume for each drop of each drop pattern;
   selecting a plurality of subsets of nozzles of a dispenser, each subset of nozzles configured to dispense a plurality of drops corresponding to each drop pattern on the substrate;
   for each drop pattern:
   i) dispensing the plurality of drops corresponding to the drop pattern from each subset of nozzles in accordance with dispense parameters of the dispensers;
   ii) obtaining an image of the plurality of drops from each subset of nozzles after plurality of drops has been dispensed away from the subset of nozzles and prior to contact of the plurality of drops with the substrate;
   iii) processing the image from each subset of nozzles to determine a positional error of the plurality of drops with respect to the target drop locations on the substrate and a volumetric error of the plurality of drops with respect to the selected volume for each drop; and
   adjusting, based on the positional error and the volumetric error of the plurality of drops from each subset of nozzles for each drop pattern, one or more of the dispense parameters of the dispenser.

2. The method of claim 1, further comprising:
   after adjusting the one or more of the dispense parameters of the dispenser, for each drop pattern:
   i) dispensing an additional plurality of drops corresponding to the drop pattern from each subset of nozzles in accordance with the adjusted dispense parameters of the dispenser;
   ii) obtaining an additional image of the additional plurality of drops from each subset of nozzles after the additional plurality of drops has been dispensed and prior to contact of the additional plurality of drops with the substrate; and
   iii) processing the additional image from each subset of nozzles to determine an additional positional error of the additional plurality of drops with respect to the target drop locations on the substrate and an additional volumetric error of the additional plurality of drops with respect to the selected volume for each additional drop; and
   further adjusting, based on the additional positional error and the additional volumetric error of the additional plurality of drops from each subset of nozzles for each drop pattern, one or more of the adjusted dispense parameters of the dispenser.

3. The method of claim 1, wherein adjusting the one or more of the dispense parameters comprises adjusting at least one of a voltage and a waveform of the dispenser.

4. The method of claim 1, wherein selecting the plurality of subsets of nozzles of the dispenser further comprises i) selecting a first subset of nozzles positioned at interior of an intended dispense area and ii) selecting a second subset of nozzles positioned at a periphery of the intended dispensed area.

5. The method of claim 1, further comprising:
   assessing the drop volume, the drop velocity, the drop ejection time, and the drop trajectory for each drop of the plurality of drops;

determining, for each drop of the plurality drops, a
volume difference between the assessed drop volume
and a target drop volume;

determining, for each drop of the plurality of drops, a
velocity difference between the assessed drop velocity
and a target drop velocity;

determining for each drop of the plurality of drops, a drop
ejection time difference between the assessed ejection
time and a target drop ejection tie;

determining, for each drop of the plurality of drops, a drop
trajectory difference of the assessed drop trajectory and
a target drop trajectory; and determining, based on at least one of the volume difference, the velocity difference, the drop ejection time difference, and the drop trajectory difference, the positional error of the plurality of drops with respect to the target drop locations on the substrate and the volumetric error of the plurality of drops with respect to the selected volume for each drop.

6. The method of claim 1, further comprising adjusting one or more of the dispense parameters of the dispenser to minimize the positional error and the volumetric error of the plurality of drops from each subset of nozzles for each drop pattern.

7. An imprint lithography fluid dispensing system comprising:
a dispenser comprising a plurality of nozzles configured to dispense a plurality of drops;
an imaging module configured to obtain images of the plurality of drops;
a controller in communication with the dispenser and the imaging module the controller configured to:
selecting a set of drop patterns, each drop pattern associated with a different set of target drop locations on a substrate and a selected volume for each drop;
select a plurality of subsets of nozzles of the dispenser, each subset of nozzles configured to dispense drops corresponding to each drop pattern on the substrate;
for each drop pattern:
i) provide a first signal to the dispenser to dispense a plurality of drops corresponding to the drop pattern from each subset of nozzles in accordance with dispense parameters of the dispenser;
ii) provide a second signal to the imaging module to obtain an image of the plurality of drops from each subset of nozzles after the plurality of drops has been dispensed away from the subset of nozzles and prior to contact of the plurality of drops with the substrate, and
iii) process the image from each subset of nozzles to determine a positional error of the plurality of drops with respect to the targeted drop locations on the substrate and a volumetric error of the plurality of drops with respect to the selected volume for each drop; and
provide a third signal to the dispenser to adjust one or more of the dispense parameters based on the positional error and the volumetric error of the plurality of drops from each subset of nozzles for each drop pattern.

8. The system of claim 7, wherein the imaging module comprises a camera and a microscope objective lens.

9. The system of claim 7, further comprising a laser, a fluorescent source, and light collimating optics that are in communication with the imaging module, the optics configured to provide a plurality of light pulses for the imaging module to obtain the image.

10. The system of claim 7, wherein the one or more dispense parameters are selected from a group consisting of a voltage and a waveform of the dispenser.

11. An imprint lithography method of manufacturing an article, comprising:
selecting a set of drop patterns, each drop pattern associated with a different set of target drop locations on a substrate and a selected volume for each drop of each drop pattern;
selecting a plurality of subsets of nozzles of a dispenser, each subset of nozzles configured to dispense a plurality of drops corresponding to each drop pattern on the substrate;
for each drop pattern:
i) dispensing the plurality of drops corresponding to the drop pattern from each subset of nozzles in accordance with dispense parameters of the dispenser;
ii) obtaining an image of the plurality of drops from each subset of nozzles after the plurality of drops has been dispensed away from the subset of nozzles and prior to contact of the plurality of drops with the substrate; and
iii) processing the image from each subset of nozzles to determine a positional error of the plurality of drops with respect to the target drop locations on the substrate and a volumetric error of the plurality of drops with respect to the selected volume for each drop;
adjusting, based on the positional error and the volumetric error of the plurality of drops from each subset of nozzles for each drop pattern, one or more of the dispense parameters of the dispenser;
dispensing an imprint resist on the substrate based on the adjusted dispense parameters of the dispenser;
contacting the imprint resist with the template such that the imprint resist fills pattern features of the template;
polymerizing the imprint resist to yield a polymeric layer in contact with the template;
separating the template from the polymeric layer to yield the article.

12. The method of claim 11 wherein adjusting the one or more of the dispense parameters comprises adjusting at least one of a voltage and a waveform of the dispenser.

13. The method of claim 11, wherein selecting the plurality of subsets of nozzles of the dispenser further comprises i) selecting a first subset of nozzles positioned at an interior of a selected dispense area and ii) selecting a second subset of nozzles positioned at a periphery of the selected dispense area.

14. The method of claim 11 further comprising:
determining, for each drop of the plurality of drops, a volume difference between the assessed drop volume and a target drop volume;
determining, for each drop of the plurality of drops, a velocity difference between the assessed drop velocity and a target drop velocity;
determining, for each drop of the plurality of drops, a drop ejection time difference of the assessed drop ejection time and a target drop ejection time;
determining, for each drop of the plurality of drops, a drop trajectory difference of the assessed drop trajectory and a target drop trajectory; and
determining, based on at least one of volume difference, the velocity difference, the drop ejection time difference, and the drop trajectory difference, the positional error of the plurality of drops with respect to the target drop locations on the substrate and the volumetric error of the plurality of drops with respect to the selected volume for each drop.

15. The method of claim 11, further comprising adjusting one or more dispense parameters of the dispenser to minimize the positional error and the volumetric error of the plurality of drops for each subset of nozzles for each drop pattern.

\* \* \* \* \*